(12) United States Patent
Aoki et al.

(10) Patent No.: US 7,855,728 B2
(45) Date of Patent: Dec. 21, 2010

(54) IMAGING APPARATUS, AND CASING OF AN IMAGING APPARATUS

(75) Inventors: Osamu Aoki, Kanagawa (JP); Takamasa Hosoya, Kanagawa (JP); Shigeru Tamura, Tokyo (JP)

(73) Assignee: Sony Corporation, Tokyo (JP)

( * ) Notice: Subject to any disclaimer, the term of this patent is extended or adjusted under 35 U.S.C. 154(b) by 987 days.

(21) Appl. No.: 11/029,417

(22) Filed: Jan. 6, 2005

(65) Prior Publication Data
US 2005/0206779 A1 Sep. 22, 2005

(30) Foreign Application Priority Data
Jan. 13, 2004 (JP) .............................. 2004-006135

(51) Int. Cl.
*H04N 7/18* (2006.01)
*H04N 5/225* (2006.01)

(52) U.S. Cl. .................. 348/143; 348/158; 348/374

(58) Field of Classification Search ................. 348/143, 348/144, 157, 158, 373, 114, 374, 375; D16/203
See application file for complete search history.

(56) References Cited

U.S. PATENT DOCUMENTS

| | | | |
|---|---|---|---|
| 5,224,675 A * | 7/1993 | Ellenberger et al. | 248/183.4 |
| 6,081,422 A * | 6/2000 | Ganthier et al. | 361/686 |
| 6,124,892 A * | 9/2000 | Nakano | 348/373 |
| D458,289 S * | 6/2002 | Ogura | D16/202 |
| D458,621 S * | 6/2002 | Kawashima | D16/202 |
| 6,466,249 B1 * | 10/2002 | Granot et al. | 348/14.08 |
| 6,503,000 B1 * | 1/2003 | Kim | 396/427 |
| 6,678,001 B1 * | 1/2004 | Elberbaum | 348/373 |
| 6,715,940 B2 * | 4/2004 | Top et al. | 396/427 |
| 6,793,414 B2 * | 9/2004 | Akada | 396/427 |
| 6,992,722 B2 * | 1/2006 | Jung | 348/373 |
| 7,116,363 B2 * | 10/2006 | Fuchimukai | 348/231.8 |
| 2001/0055487 A1 * | 12/2001 | Akada | 396/427 |
| 2002/0130964 A1 | 9/2002 | Fuchimukai | |
| 2003/0194230 A1 * | 10/2003 | Tamura | 396/427 |

FOREIGN PATENT DOCUMENTS

| | | |
|---|---|---|
| EP | 1 008 973 A1 | 6/2000 |
| JP | 2000-358172 | 12/2000 |

* cited by examiner

*Primary Examiner*—Sinh Tran
*Assistant Examiner*—Albert H Cutler
(74) *Attorney, Agent, or Firm*—Oblon, Spivak, McClelland, Maier & Neustadt, L.L.P.

(57) ABSTRACT

A stationary type imaging apparatus reduced in size and in weight. The imaging apparatus includes an imaging unit for imaging an object and a casing carrying the imaging unit and also carrying a component mounting unit on its bottom for mounting component parts of the imaging apparatus. On the component mounting unit, a first wiring board is provided for extending along a bottom plate of the casing, and a second wiring board is provided for extending towards the imaging unit in a state separated from the first wiring board.

12 Claims, 18 Drawing Sheets

IMAGING APPARATUS, AND CASING OF AN IMAGING APPARATUS

BACKGROUND OF THE INVENTION

1. Field of the Invention

This invention relates to a stationary type imaging apparatus for imaging the indoor or outdoor state from a fixed position.

This application claims priority of Japanese Patent Application 2004-006135, filed on Jan. 13, 2004, the entirety of which is incorporated by reference herein.

2. Description of Related Art

A stationary type imaging apparatus, mounted at a preset position, such as on a ceiling or a wall in a room or an outer wall outside the building for imaging the indoor or outdoor state, has an imaging unit enclosed in a casing, mounted on the ceiling or wall, and is mounted on a ceiling or on an upper part of the inner wall of a church or a concert hall, for imaging the state of the Mass in a church or a music concert in a concert hall from an upper point towards an oblique lower area. In such imaging apparatus, in distinction from a monitor imaging device for imaging a preset range of an outdoor scene for crime prevention purposes, the entire indoor space of a broad range needs to be imaged to a high image quality, while the image size of the object imaged needs to be enlarged or contracted as the object is imaged. Thus, there is provided, in a casing of an imaging apparatus, housing an imaging device, a panning mechanism and a tilt mechanism for causing rotation of the imaging unit in the panning direction and in the tilt direction with respect to the mounting surface of the imaging apparatus, respectively, so as to provide for a broad-range imaging. The imaging device of the imaging apparatus is also provided with a zooming mechanism for adjusting the imaging size of the object as the object is imaged.

In such imaging apparatus, a variety of electrical circuits, such as control circuits for the panning mechanism and the tilt mechanism, power supply circuit or signal processing circuit for imaging signals, are formed on one wiring board. Thus, with the imaging apparatus, the wiring board is increased in size, and the casing in which to install the wiring board is also increased in size, thus increasing the weight of the overall apparatus. If the imaging apparatus, mostly installed on a ceiling or an upper wall part in a room, is increased in weight, it is necessary to take reinforcing measures to prevent its descent, or otherwise it becomes difficult to perform the installing operation. Moreover, the imaging apparatus needs to be reduced in size or rendered less obtrusive in order not to detract from the appearance of the environment in which to mount the apparatus.

[Patent Publication 1] Japanese Laid-Open Patent Publication 2000-358172

SUMMARY OF THE INVENTION

It is therefore an object of the present invention to provide an imaging apparatus reduced in size and weight.

For accomplishing this object, the present invention provides an imaging apparatus comprising an imaging unit for imaging an object, and a casing carrying the imaging unit and provided on a bottom part thereof with a component mounting unit for mounting components thereon. A first wiring board is arranged on the component mounting unit for extending along a bottom plate of the bottom part and a second wiring board is arranged towards the imaging unit in a spaced apart relation with respect to the first wiring board.

According to the present invention, a variety of electrical circuits, such as control circuits for the panning mechanism and the tilt mechanism, power supply circuit or signal processing circuit for imaging signals, are mounted in a shared fashion on the first wiring board and on the second wiring board, so that the wiring boards may be reduced in size. Consequently, the casing for housing the wiring board therein may be reduced in size, and hence the overall apparatus may be reduced in size and weight. Moreover, with the present invention, in which the apparatus in its entirety may be reduced in size, the apparatus may be mounted in a desired place without detracting from the appearance of the environment in which to mount the apparatus.

DESCRIPTION OF THE PREFERRED EMBODIMENTS

Figure 1:
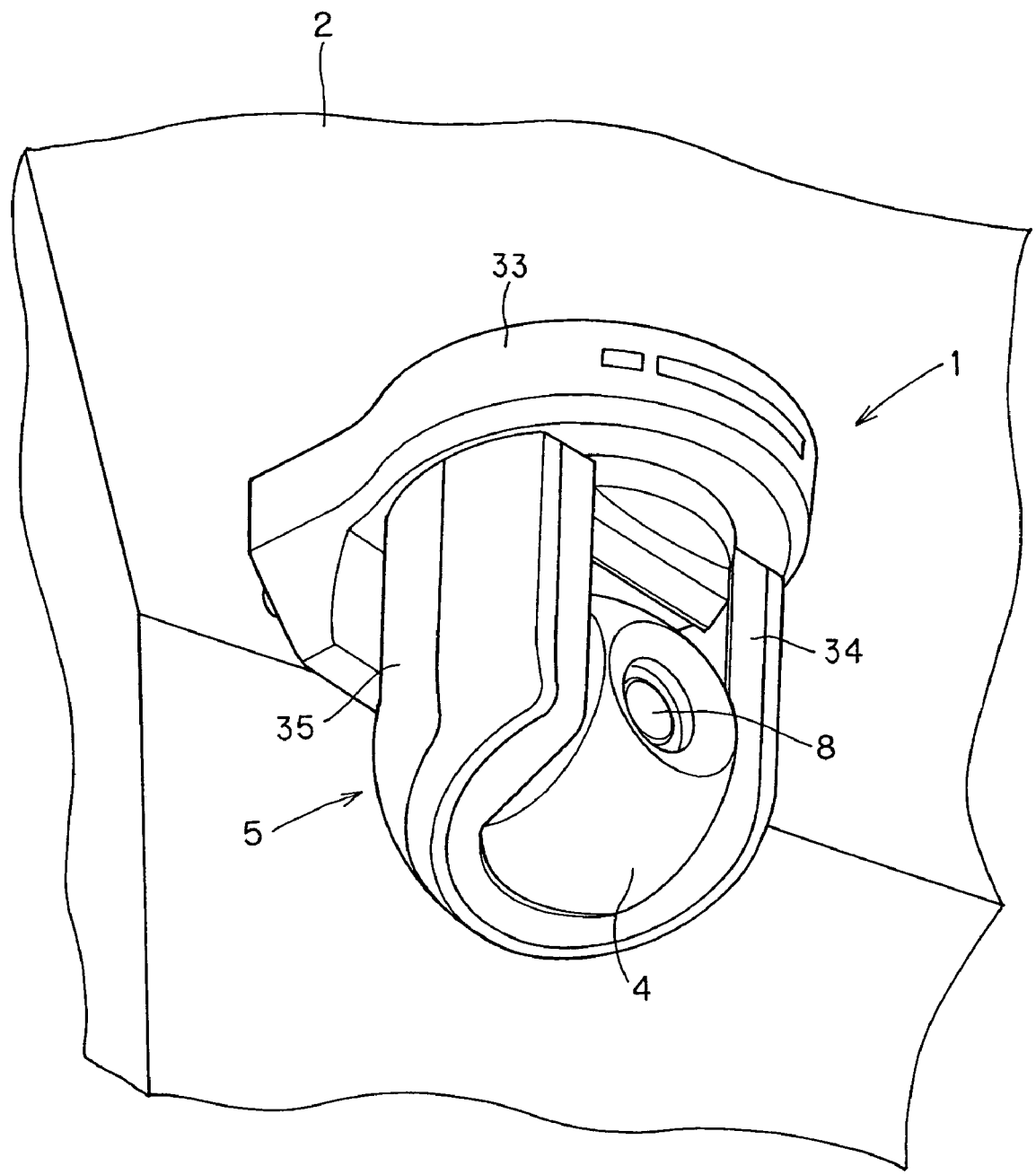
FIG. 1 shows the state in which an imaging apparatus of the present invention has been mounted on the ceiling.

Referring to the drawings, an imaging apparatus according to the present invention is hereinafter explained in detail.

Figure 2:
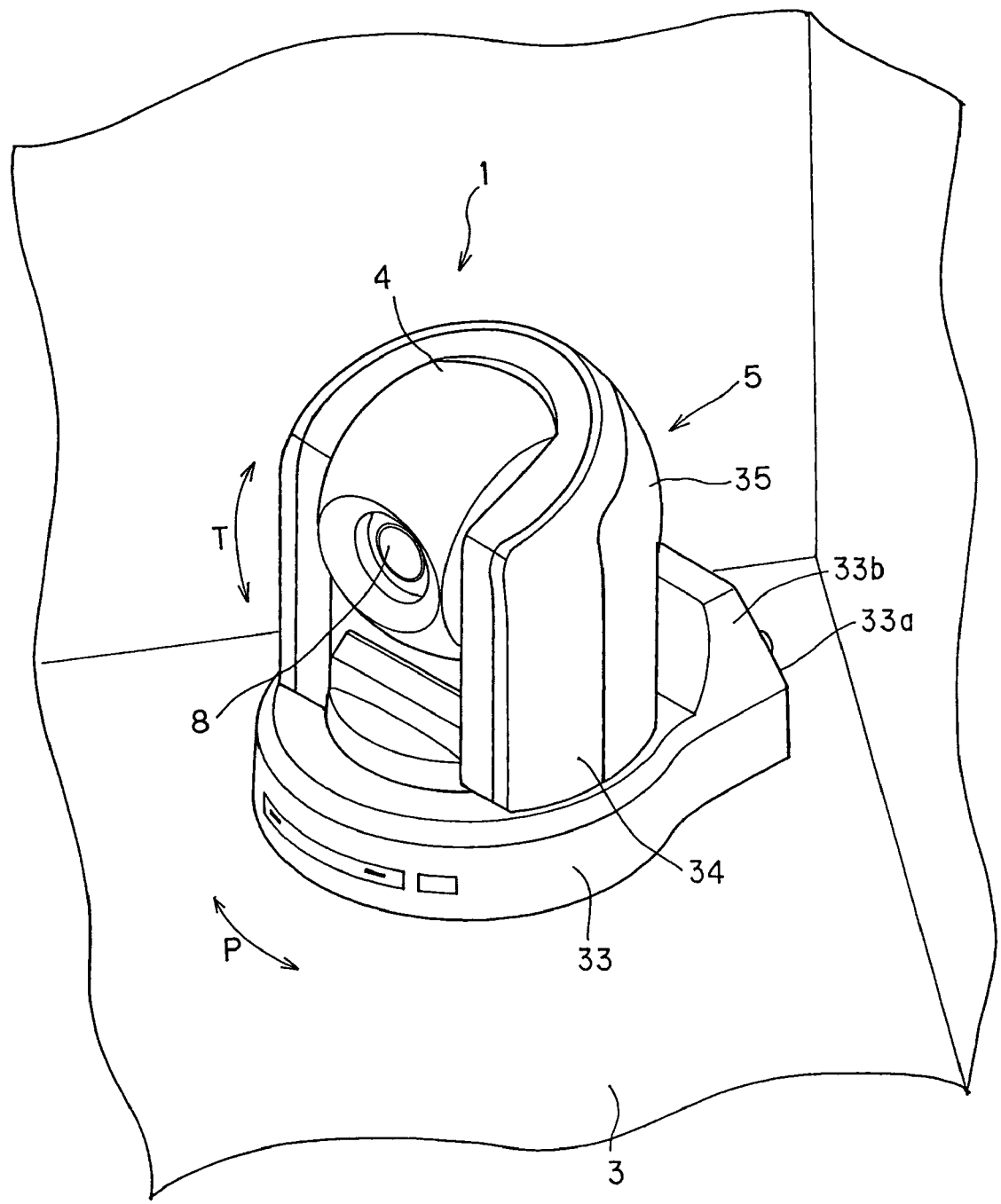
FIG. 2 shows the state in which the imaging apparatus has been mounted on the floor.
Figure 3:
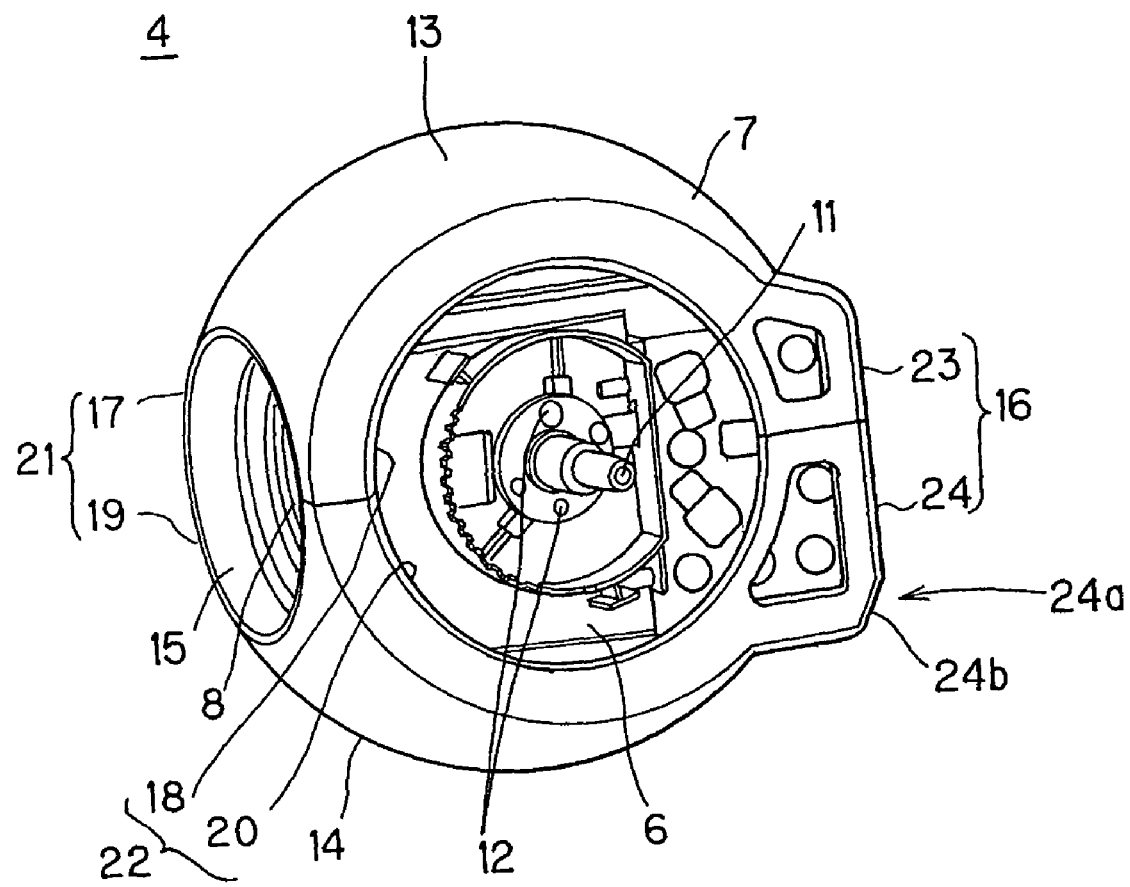
FIG. 3 is a perspective view showing the imaging apparatus from a transverse lateral side thereof.

An imaging apparatus 1 is mounted in an upside-down position on a ceiling 2 of a room, as shown in FIG. 1, or mounted on a floor 3, as shown in FIG. 3, for imaging the state in the room or an outdoor scene. In place of being mounted in an up-and-down position, as shown in FIGS. 1 and 2, the imaging apparatus 1 may also be mounted to an outer wall or an inner wall substantially at right angles thereto. The imaging apparatus 1 includes an imaging unit 4 for imaging the state in a room or an outdoor scene, and a casing 5 for holding the imaging unit 4 therein. The imaging apparatus 1 also includes a tilt mechanism for causing rotation of the imaging unit 4 in the tilt direction and a panning mechanism for causing rotation thereof in the panning direction.

Figure 4:
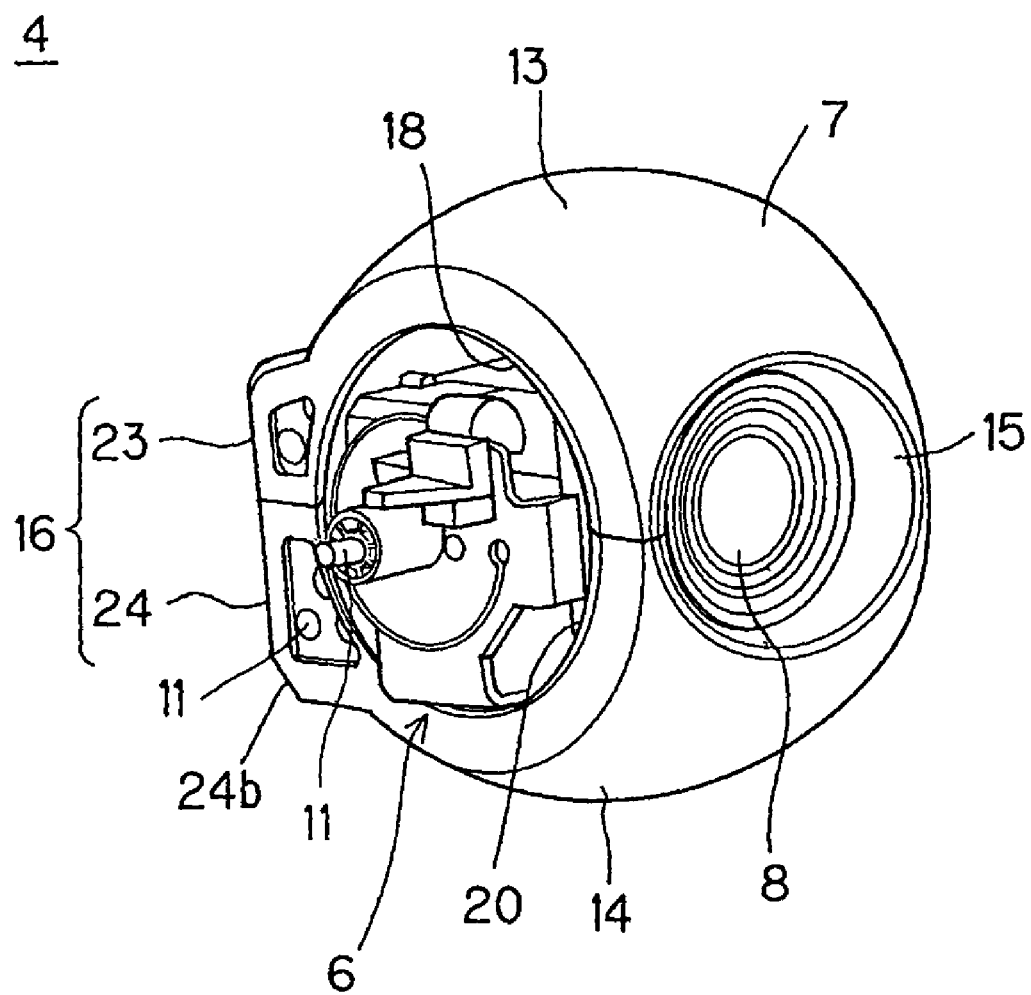
FIG. 4 is a perspective view showing the imaging apparatus from the opposite transverse lateral side thereof.
Figure 5:
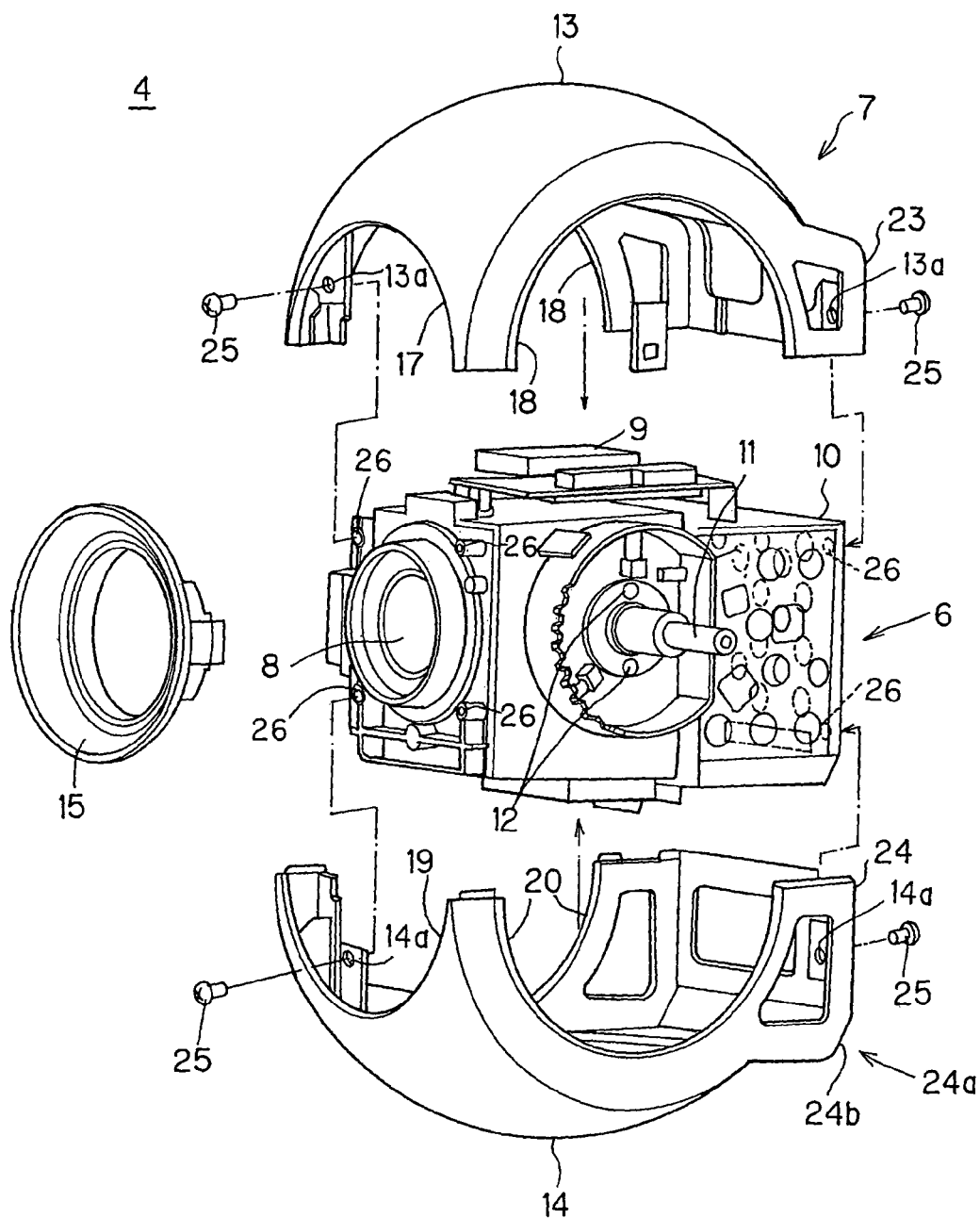
FIG. 5 is an exploded perspective view of an imaging unit.

Referring to FIGS. 3 to 5, the imaging unit 4 is made up by an imaging device 6 and a cover 7 for holding the imaging device 6 therein. The imaging device 6 is substantially rectangular in profile and has a transverse side, formed by a short side, as a front surface, on which front surface is mounted an imaging lens 8. In the imaging unit 4, a substrate unit 9, carrying e.g. a circuit for converting an optical image from the imaging lens 8 into electrical signals to generate image signals, and a shield member 10 for dissipating the heat evolved in the imaging apparatus, are mounted from the imaging lens 8 towards the back side. On each lateral side, that is, each short side, of the imaging device 6, a tilt shaft 11 is mounted by a set screw 12, so that the tilt shaft 11 is protruded substantially at right angles to the lateral side, as shown in FIGS. 3 and 4. The tilt shaft 11, mounted to one lateral surface, is coupled to a tilt mechanism, which will be explained subsequently.

The imaging device 6 includes an imaging device, such as a charge-coupled device (CCD), for receiving the condensed light to image an object by photoelectric conversion. Specifically, the imaging device 6 is a camera of the so-called 3CCD system including a spectrographic prism of an optical system, not shown, for separating the light condensed by the imaging lens 8 into red, green and blue components, with the camera having three CCDs for coping with so separated color components. With the imaging device 6, an image of a high image quality may be formed by the three CCDs.

Referring to FIG. 5, a cover for the imaging device 7 is made up by an upper cover 13, a lower cover 14 and a front cover 15. By combining the upper cover 13, lower cover 14 and the front cover 15, there is defined an inner housing space for the imaging device 6. The imaging device 6 is protected by being housed within this housing space. The parts of the cover 7 facing the upper and lower sides of the imaging device 6 are formed to a substantially spherical outer profile, while those facing the lateral sides thereof are formed to a substantially planar outer profile. An imaging lug 16 for accommodating the back side of the substantially rectangular imaging device 6 is formed on the back side of the cover for the imaging device.

The upper cover 13 is formed to a substantially semispherical shape, and a substantially U-shaped opening 17 is formed in the front side of the upper cover faced by the imaging lens 8 of the imaging device 6. A substantially U-shaped opening 18 is formed in each lateral surface along the short side direction of the imaging device 6. Similarly to the upper cover 13, the lower cover 14 is formed to a substantially semispherical shape, and a substantially U-shaped opening 19 is formed in the front side of the lower cover faced by the imaging lens 8 of the imaging device 6. An opening 20 is also formed in each lateral surface along the short side direction of the imaging device 6. With the upper and lower covers 13, 14 having the openings 17 to 20, as described above, in case the upper and lower covers 13, 14 are combined together, a lens opening 21 is formed by the openings 17, 19 formed in the front surfaces of the upper and lower covers 13, 14, respectively, for exposing the imaging lens 8 to outside, while a shaft opening 22 is formed by the openings 18, 20 formed in the lateral surfaces of the upper and lower covers, respectively, for exposing the tilt shaft 11 to outside. The back surface sides of the upper cover 13 and the lower cover 14 are formed with an upper cover lug 23 and a lower cover lug 24, respectively, for forming the imaging lug 16 for accommodating e.g. a shield member 10 of the imaging device 6. The lower cover lug 24 is chamfered at 24b along the short side of the imaging device 6.

The front cover 15 is fitted in the lens opening 21, defined on combining the upper and lower covers 13, 14 together, for protecting the imaging device 6 from outside. The front cover 15 has a diameter towards the imaging lens 8 substantially equal to the diameter of the imaging lens 8. The diameter of the front cover 15 towards the imaging lens 8 is enlarged in a direction towards outside such that the outer side diameter of the front cover is larger than its imaging lens side diameter.

When the imaging device 6 is accommodated in the cover for the imaging device 7, the upper cover 13 and the lower cover 14 are fitted over the imaging device 6 from the upper and lower sides thereof, respectively. The upper cover 13 is secured to the imaging device 6 by set screws 25 which are passed through through-holes 13a formed in both inner side ends of front and back sides of the imaging device 6 and which are threaded in tapped holes 26 formed in the lower parts of both front side ends of the imaging device 6. The lower cover 14 is secured to the imaging device 6 by set screws 25 which are passed through through-holes 14a formed in both inner side ends of front and back sides of the imaging device 6 and which are threaded in tapped holes 26 formed in the lower parts of both front side ends of the imaging device 6. The front cover 15 is then fitted in the lens opening 21. When the imaging device 6 is accommodated in the cover for the imaging device 7, the imaging lens 8 is exposed to outside from the front cover 15 fitted in the lens opening 21, whilst the tilt shaft 11 is protruded to outside from the shaft opening 22. The shield member 10 of the imaging unit 4 is housed by the imaging lug 16.

With the above-described imaging unit 4, in which the upper and lower surfaces of the imaging device 6 are substantially spherically-shaped, and in which back-side part of the imaging device 6, protruded from the spherical shape, is covered by the imaging lug 16, the size of the cover 7 relative to the imaging device 6 may be minimized, thereby reducing the size and the weight of the overall apparatus. Moreover, with the imaging unit 4, in which the cover 7 is substantially spherical-shaped and in which the imaging device 6 is substantially parallelepipedically-shaped, in contrast to the substantially spherical shape of the cover 7, there is defined a spacing between the imaging device 6 and the cover 7. Thus, with the imaging unit 4, this spacing may be exploited for mounting the board unit 9 of the imaging device 6 on the upper or lower surface of the imaging device 6 for minimizing the size of the imaging device 6. This imaging unit 4 is mounted within the casing 5 by support units 30 carrying both lateral surfaces of the imaging device from which is protruded the tilt shaft 11.

Figure 6:
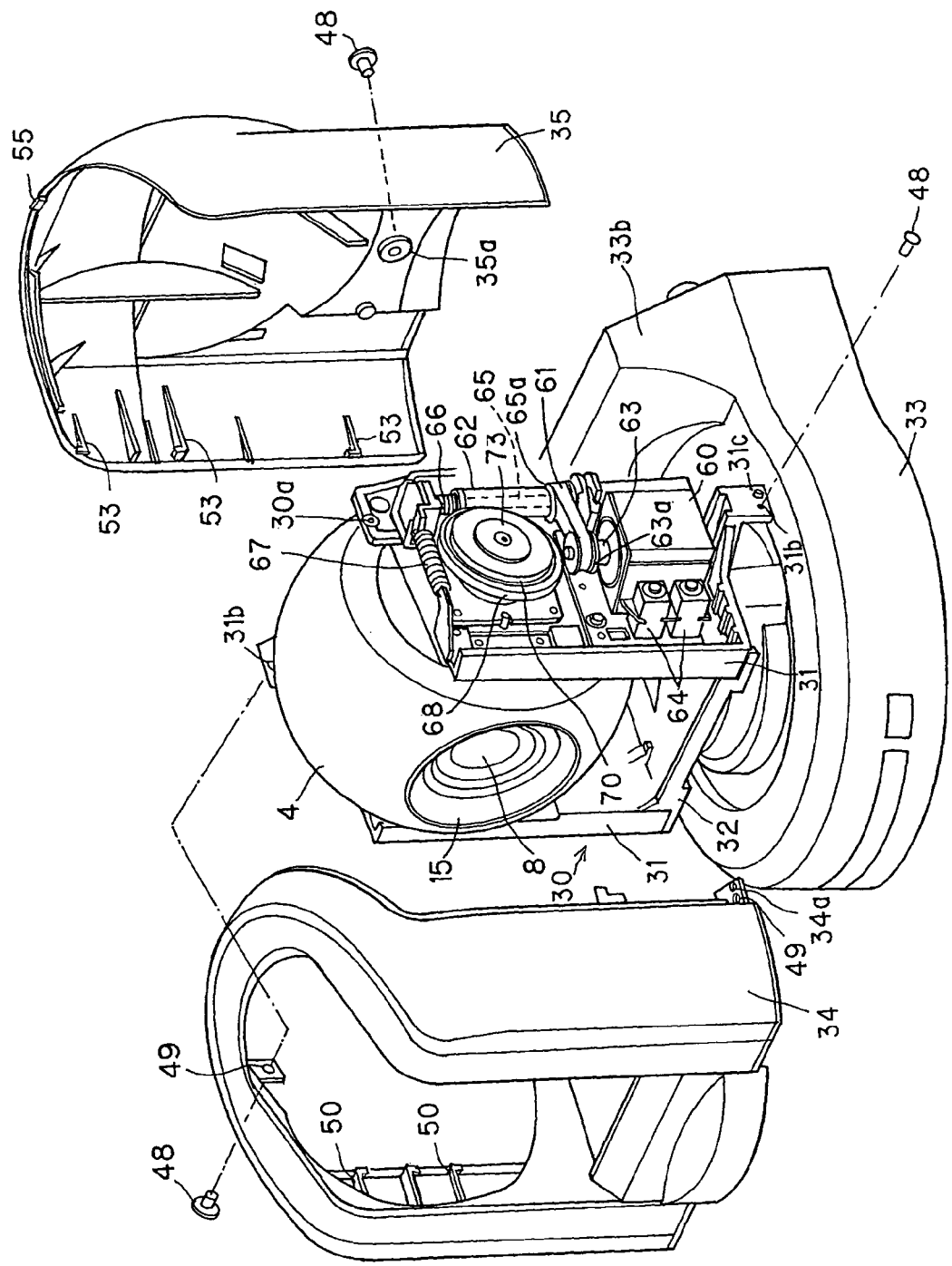
FIG. 6 is an exploded perspective view of the imaging apparatus.
Figure 14:
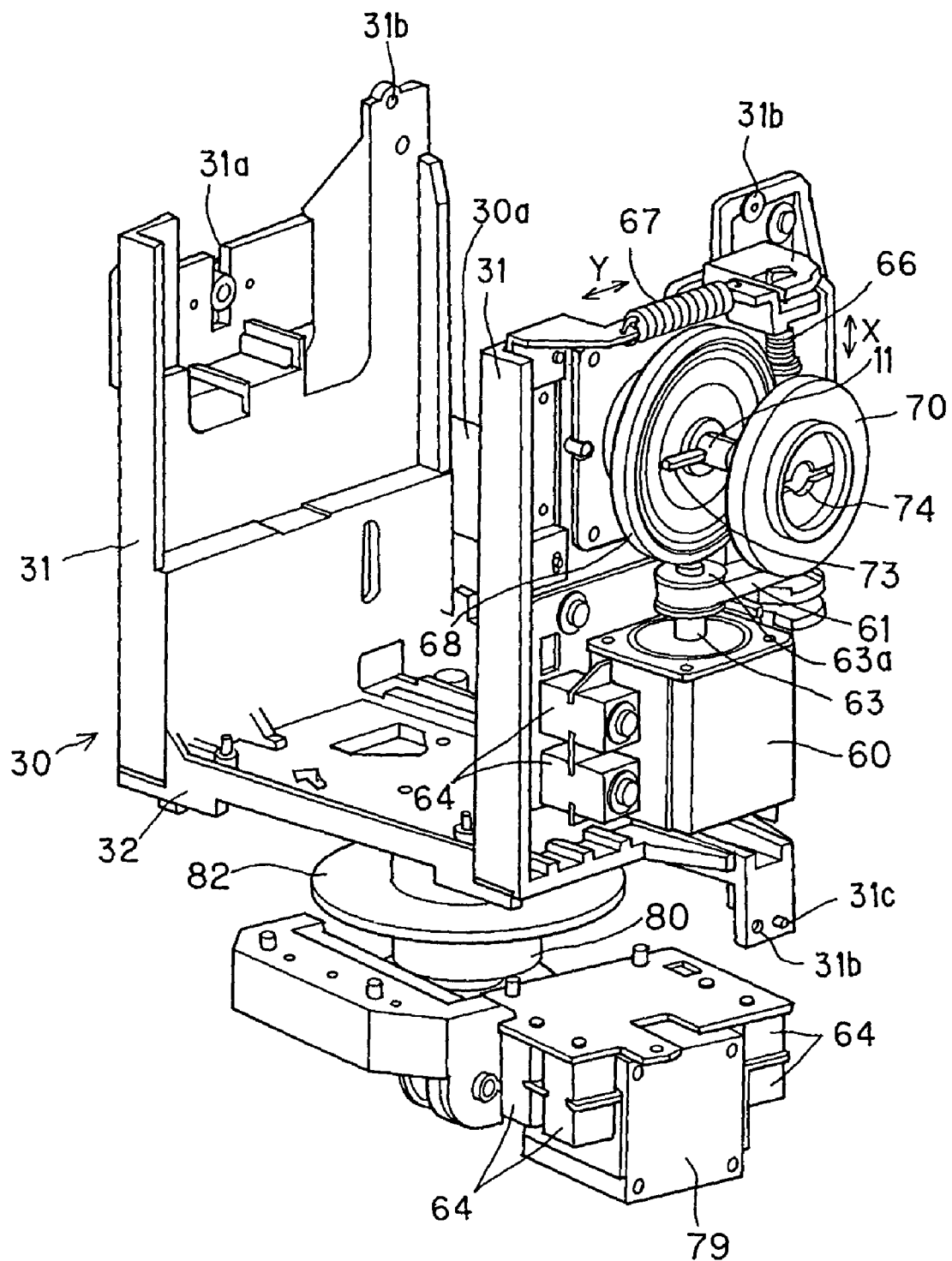
FIG. 14 is a perspective view of the tilt and panning mechanisms.

Referring to FIG. 6, the support unit 30 includes a pair of rotation supports 31, 31 carrying the imaging unit 4 in the tilt direction, and a connecting member 32 the ends of which mount the rotation supports 31, 31. The support unit 30 is so configured that the paired rotation supports 31, 31 are positioned on both lateral sides of the imaging unit 4 and are connected at one ends thereof to the connecting member 32, with the support unit 30 being recessed in shape, with the imaging unit 4 being housed in an inner opening of the recessed part of the support unit. Specifically, the support unit 30 carries the imaging unit 4, as shown in FIG. 6, by introducing the tilt shaft 11 of the imaging unit 4 through a bearing 31a provided in each lateral surface along the short side direction of the imaging unit 4 and which is formed in an opening part of the recess, as shown in FIG. 14. The support unit 30 rotationally carries the tilt shaft 11 in the tilt direction by having the tilt shaft 11 inserted in the bearing 31a.

The support unit 30 has tapped holes 31b in an end of each rotation support 31 towards the connecting member 32 and in an end of each rotation support towards the opening side of the recess, as an aid for screwing a front cover 34, as later explained. The support unit 30 also has a protrusion 31c for positioning the front cover 34 so that the protrusion is adjacent to the tapped hole 31b at an end thereof towards the connecting member 32. On the back side of the support unit 30, there is provided a substantially plate-shaped back surface piece 30a connected to the paired rotation supports 31, 31. In a mid part of this back surface piece 30a, there is provided a tapped hole, not shown, for screwing the back cover 35, as will be explained subsequently.

In the support unit 30, a tilt mechanism connected to the tilt shaft 11 for causing rotation of the imaging unit 4 in the tilt direction is provided on the outer surface of the rotation support 31. The back side of the connecting member 32 of the support unit 30 is connected to the panning mechanism adapted for causing rotation of the imaging unit 4 in the panning direction.

Referring to FIG. 6, the casing 5 is made up by a base unit 33 for carrying the support unit 30 from the bottom side, the front cover 34 and a back cover 35 for covering the imaging unit 4 and the support unit 30.

Figure 7:
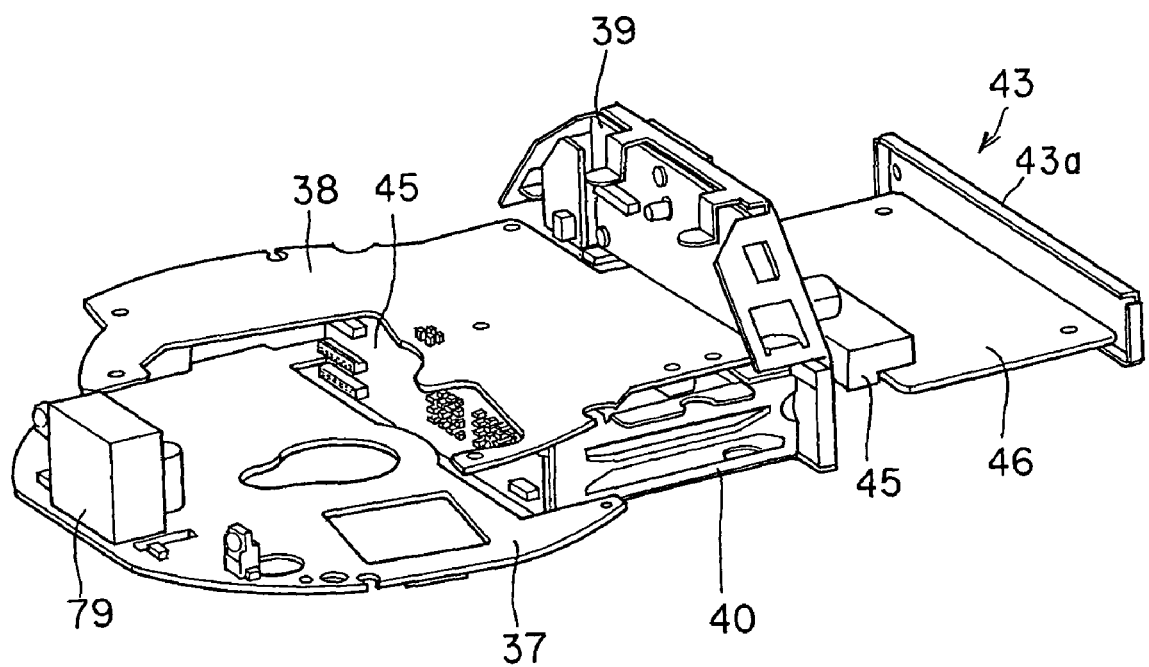
FIG. 7 is a perspective view of a component mounting unit.
Figure 8:
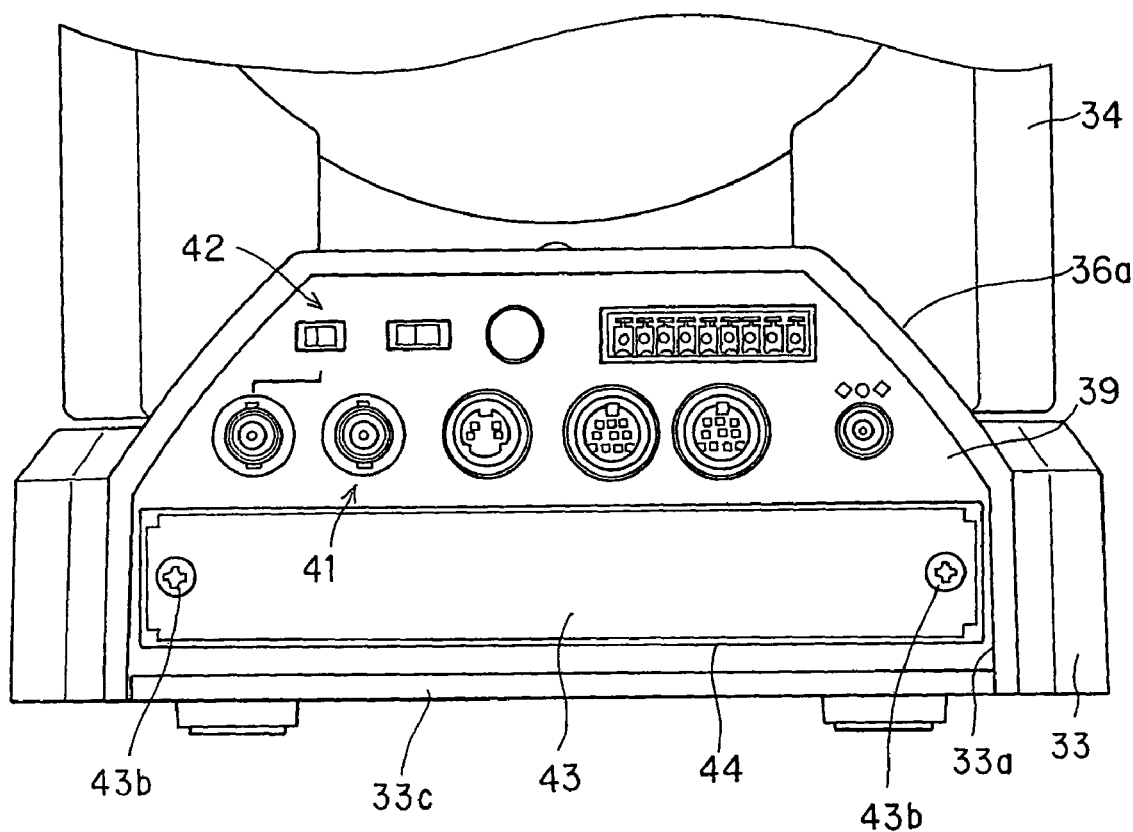
FIG. 8 is a plan view of a base unit, looking from the back side.

The base unit 33 carries the support unit 30 from the back side of the connecting member 32 to support the support unit 30 in its entirety. Within the base unit 33, there is mounted a component mounting unit 35, on which a wiring board, for example, is mounted, as shown in FIG. 7. The base unit 33 has a substantially arcuate-shaped front surface and includes, in its back surface, an opening recess 33a for exposing the wiring board of the component mounting unit 35 to outside, as shown in FIG. 8. The base unit 33 includes a protrusion 33b, extending substantially at right angles to a bottom plate 33c of the base unit 33, as shown in FIG. 8. In the inside of the base unit 33, there is provided a panning mechanism for rotating the support unit 30, carrying the imaging unit 4, in the panning direction. The base unit 33 is provided with a sensor, not shown, on a forward upper surface, for detecting the rotational position of the support unit 30, rotated by the panning mechanism.

Referring to FIGS. 7 and 8, the component mounting unit 35 includes a first wiring board 37, carrying at least a power supply circuit, a second wiring board 38, carrying at least a signal processing circuit, and a third wiring board 39, for electrically interconnecting the imaging device 1 and an external electrical device, not shown. The component mounting unit 35 includes an extension unit mounting section 40 for mounting another external circuit board, not shown, between the first wiring board 37 and the second wiring board 38.

On the first wiring board 37, there are mounted a power supply circuit for supplying the power from an external power supply to the imaging apparatus 1 in its entirety, a driving motor 79 for driving the panning mechanism, formed on the substrate, and a circuit for electrically interconnecting the driving motor 79 and the panning mechanism, as shown in FIGS. 7 and 8. The first wiring board 37 is mounted on the front surface side of the imaging apparatus 1 for extending along the bottom plate 30c of the base unit 33 from the front surface side up to the extension unit mounting section 40 provided towards the back surface side. By arranging the first wiring board 37 along the bottom plate 30c of the base unit 33, component parts having a certain height, such as the driving motor 79, may be mounted in a space above the first wiring board.

On the second wiring board 38, there is mounted e.g. a signal processing circuit for processing picture signals output from the imaging unit 4. Specifically, there is mounted a circuit for transducing an optical image from the imaging lens 8 of the imaging device 6 into electrical signals to output the so generated signals to an output terminal. The second wiring board 38 is mounted on the back surface side of the imaging apparatus 1 and carries thereon an electrical circuit. That is, no component parts with a certain height, such as the driving motor 79, are mounted on the second wiring board, on which only electrical components with a limited height, such as a flat package, are loaded, such that the second wiring board may be arranged in an upper portion within the inside of the base unit 33. Hence, a spacing is defined between the first wiring board 37 and the second wiring board 38 and, within this spacing, there is mounted the extension unit mounting section 40 carrying an extension unit, not shown. The second wiring board 38 is electrically connected to the first wiring board 37 by a flexible board, not shown.

On the third wiring board 39, there are mounted a set of connectors 41, such as an output terminal for connection to external electrical equipment, e.g. a remote display device, or an input terminal for a connecter power supply for connection of a remote operating device, such as the panning mechanism or the tilt mechanism, and a set of switches 42 for setting switching, as shown in FIG. 8. The third wiring board 39 is mounted substantially at right angles to the second wiring board 38 for protruding towards the support unit 30. The third wiring board 39 is electrically connected to the first wiring board 37 and to the second wiring board 38 by a flexible board, not shown.

Figure 9:
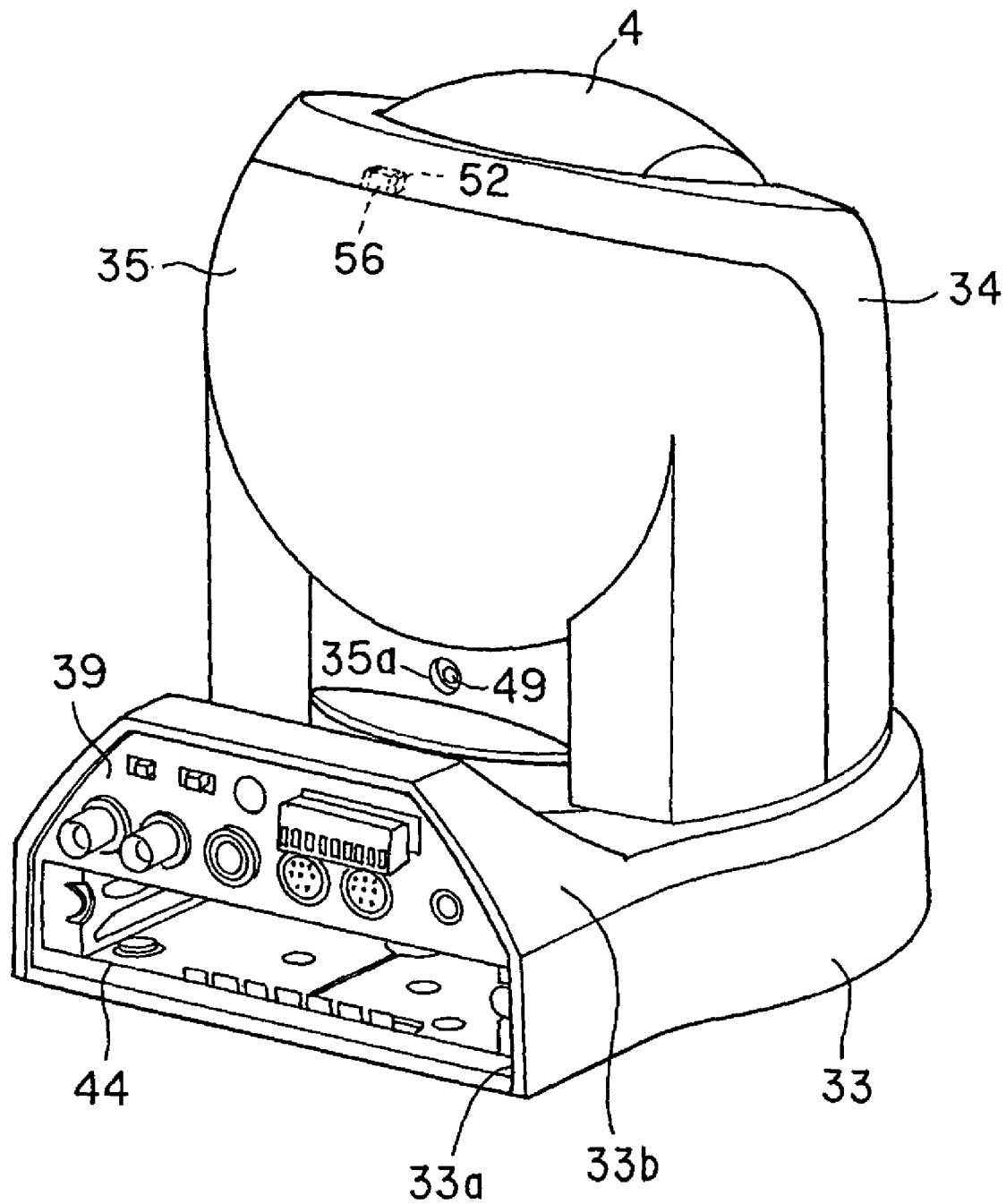
FIG. 9 is a perspective view of the imaging apparatus, looking from the back side.

The extension unit mounting section 40 carries an extension unit 43 for expanding the function of the imaging apparatus 1, such as a wireless communication unit, as shown in FIGS. 7 and 9. The extension unit mounting section 40 is provided between the first wiring board 37 on one hand and the second and third wiring boards 38, 39 on the other hand. The extension unit mounting section 40 includes an insertion/ejection opening 44 in its back surface for insertion/ejection of the extension unit 43. The extension unit mounting section 40 is provided with a fourth wiring board 45 on which abuts the distal end of the extension unit 43 inserted via the insertion/ejection opening 44 and which is provided substantially at right angles to the first wiring board 37.

On a board 46 of the extension unit 43, there is formed a circuit for controlling the picture signals output from the imaging unit. A connector 47 interconnecting this circuit and the fourth wiring board 45 is provided at an inserting end of the substrate 46. A closure plate 43a for closing the insertion/ejection opening 44 is mounted to an end of the extension unit 43 opposite to the inserting end. The extension unit 43 is mounted to the extension unit mounting section 40 via the insertion/ejection opening 44 and subsequently secured to the extension unit mounting section 40 by a set screw 43b. The insertion/ejection opening 44 is provided at a position facing the fourth wiring board 45 and, when the component mounting unit 35 is mounted within the base unit 33, the insertion/ejection opening is arranged in a lower portion of the opening recess 33a of the base unit 33.

The fourth wiring board 45 is mounted substantially at right angles to the first wiring board 37 and is connected by a connecter to the extension unit 43. The fourth wiring board 45 is electrically connected by a flexible substrate to the first wiring board 37 and the second wiring board 38, and the extension unit 43 is inserted via the insertion/ejection opening 44 so as to be connected to a connector 47 provided to the distal end of the substrate 46. In case the extension unit 43 is not mounted, a dummy unit, not shown, is mounted to the extension unit 43.

With the above-described component mounting unit 35, the wiring board is divided into two wiring boards, namely the first wiring board 37 carrying e.g. the power supply circuit, and the second wiring board 38, carrying e.g. the signal processing circuit, as shown in FIG. 7 so that the size of one wiring board is reduced in size. Thus, with the component mounting unit 35, in which the first wiring board 37 is arranged along the bottom plate 33c of the base unit 33, and the second wiring board 38 is spaced apart from the first wiring board 37 and mounted closer than the first wiring board 37 to the imaging unit 4, the mounting area for the wiring board may be smaller. Since the component mounting unit 35, employing the split circuit boards, that is, the first and second wiring boards 37, 38, may now be reduced in size, the imaging apparatus 1 in its entirety may be reduced in size. Moreover, the component mounting unit 35 may be reduced in size by mounting the first and second wiring boards 37, 38 in a spaced apart relation to each other to provide a gap between the first and second wiring boards 37, 38, and by mounting the extension unit 43 via the so produced spacing in the spacing from outside.

Figure 10:
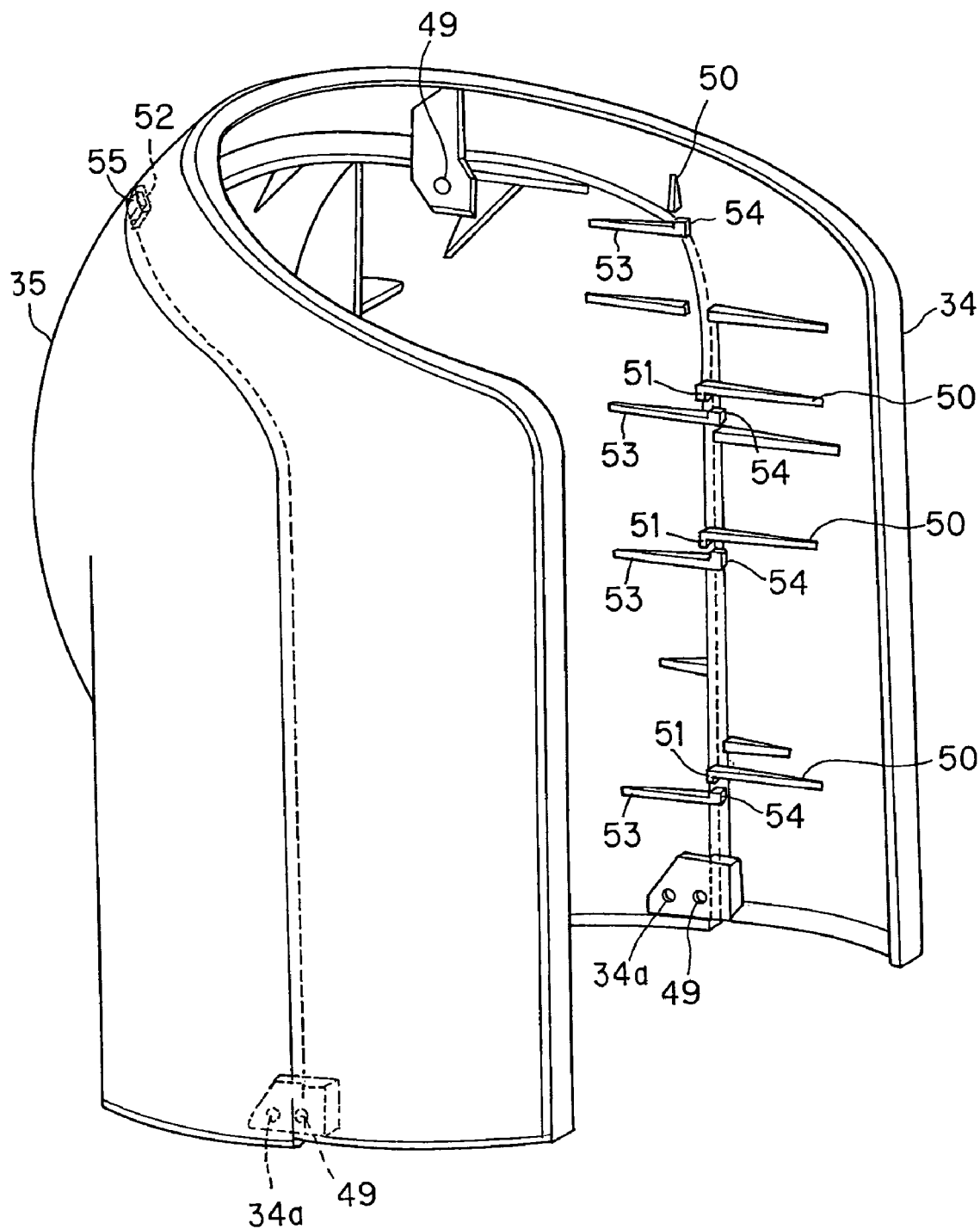
FIG. 10 is a perspective view showing the state prior to interconnection of front and back covers.

The front cover 34 and the back cover 35, protecting the imaging unit 4, cover up the imaging unit 4 and the support unit 30 to protect the imaging unit 4 housed in the inside part. The front cover 34 covers up the forward lateral sides of the imaging unit 4 and the support unit 30 and an area from the front surface side towards the back surface side of an upper outer rim of the imaging unit 4, with a portion of the front cover being opened in register with the area of rotation of the imaging lens 8 when the imaging unit 4 is rotated in the tilt direction, as shown in FIG. 2. The front cover 34 is formed so as not to contact with the upper surface of the base unit 33. The height of the front cover 34 from the upper surface of the base unit 33 is larger towards the back surface side than towards the front surface side. A plural number of through-holes 49 are formed in plural tiers in the inner wall of the front cover 34 for use in securing the front cover to the to the support unit 30 by set screws 48. These through-holes are formed in both ends towards the inner back surface covering up the upper outer rim of the imaging unit 4 and the lower lateral surfaces, as shown in FIGS. 6 and 10. The front cover 34 is secured to the support unit 30 by introducing the set screws 48 in the though-holes 49 and threading the set screws 48 in the tapped holes 31b formed in the support unit 30, as shown in FIG. 6. A positioning hole 34a is formed in the front cover 34 adjacent to each of the though-holes 49 which are formed towards lower parts of the lateral sides thereof so as to be engaged by the positioning protrusions 31 provided to the rotation supports 31. The front cover 34 is secured in position relative to the rotation supports 31 by the positioning protrusion 31c being fitted in the positioning holes 34a.

The back cover 35 covers up the back surface of the imaging unit 4 opposite to its front surface provided with the imaging lens 8, and the back surface sides of the lateral surfaces of the imaging unit 4 and the support unit 30 and, similarly to the front cover 34, is formed so as not to contact with the upper surface of the base unit 33. The shape of the back cover 35 towards the back side surface of the imaging unit 4 is coincident with the shape of the rotational area of the imaging lug 16 when the imaging unit 4 is rotated in the tilt direction relative to the mounting surface. Since the imaging unit 4, covered up by the back cover 35, is of the smallest size, insofar as rotation is not impeded, the imaging apparatus 1 in its entirety may be reduced in size. A through-hole 35a for passage of the set screw 48 for securing the back cover 35 to the support unit 30 is formed in a lower mid part of the back cover. The back cover 35 is secured to the support unit 30 by passing the set screw 48 through the through-hole 35a into a tapped hole, not shown, formed in the back surface piece 30a of the support unit 30.

The front cover 34 and the back cover 35 are combined together by retention parts formed in the respective covers. Specifically, the inner wall sections of both lateral sides of the front cover 34 are formed with plural tiers of first retention parts 50 for extending substantially at right angles to the contacting surface thereof with the back cover 35, as shown in FIG. 10. The first retention parts 50, formed on the inner lateral wall section, are provided on the ends towards the back surface 35 with plural retention pawls 51 bent substantially at right angles to the mounting surface. An engagement recess 52 is formed at an end contacting with the back cover 35 of a mid part of the inner wall section covering up the upper part of the imaging unit 4 of the front cover 34.

A second retention part 53 is formed on the back cover substantially for extending at right angles to the surface of the back cover contacting with the front cover 34. The second retention part 53 is provided facing the first retention part 50 of the front cover 34. The end of the second retention part 53 towards the front cover 34 includes a retention pawl 54 bent substantially at right angles towards the opposite side of the mounting surface so as to be retained by the retention pawl 51 of the first retention part 50. The back cover 35 includes an engagement protrusion 55, engaged by an engagement recess 52, provided in the front cover 34, at a position facing an engagement recess 52.

Figure 11:
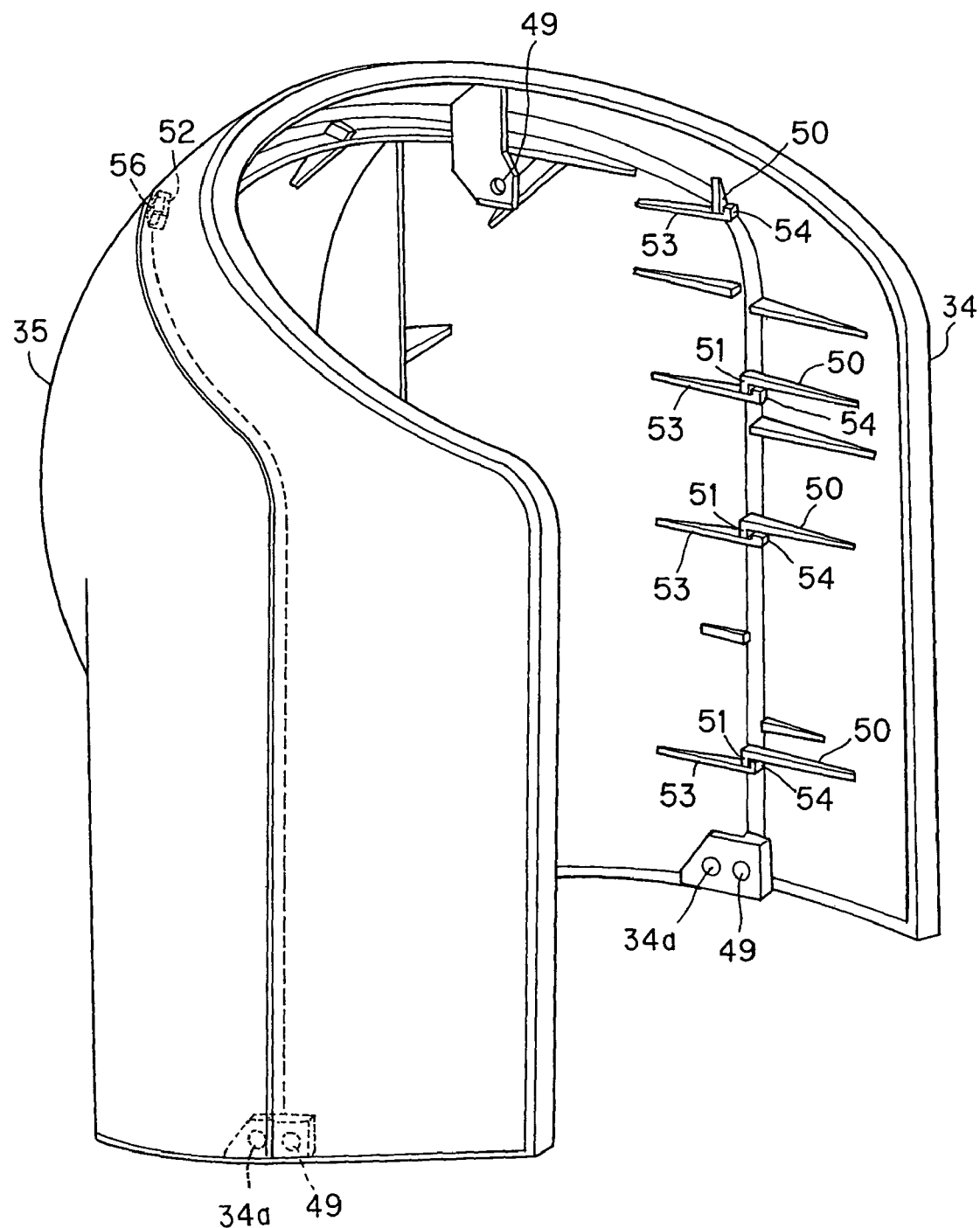
FIG. 11 is a perspective view showing the state subsequent to interconnection of front and back covers.

In connecting the front cover 34 and the back cover 35 to each other, the back cover 35 is mated to the front cover 34 from the underside thereof, as shown in FIG. 10. When the front cover 34 and the back cover 35 are mated to each other in this manner, the second retention part 53 of the back cover 35 is not retained by the first retention parts 50 of the front cover 34. The back cover 35 is then uplifted, whereby the retention pawl 51 of the first retention part 50 is engaged with the retention pawl 54 of the second retention part 53, and the engagement protrusion 55 of the back cover 35 is engaged in the engagement recess 52 provided in the front cover 34, so that the front cover 34 and the back cover 35 are now combined with each other, as shown in FIG. 11. The front cover, thus coupled to the back cover, is secured to the support unit 30 by introducing the set screw 48 through the through-hole 49 and threading the set screw into the tapped hole 30b, as shown in FIG. 6. The back cover 35 is secured to the support unit 30 by introducing the set screw 48 through the through-hole 35a and threading the set screw into a tapped hole, not shown, formed in the support member 30.

The tilt mechanism for rotating the imaging unit 4 in the tilt direction as shown in FIG. 2 and the panning mechanism for rotating it in the panning direction, as shown in FIG. 2, are hereinafter explained. Since the tilt mechanism and the panning mechanism are formed by similar configurations and are actuated by the same driving method, the tilt mechanism is now explained, as an example.

Figure 12:
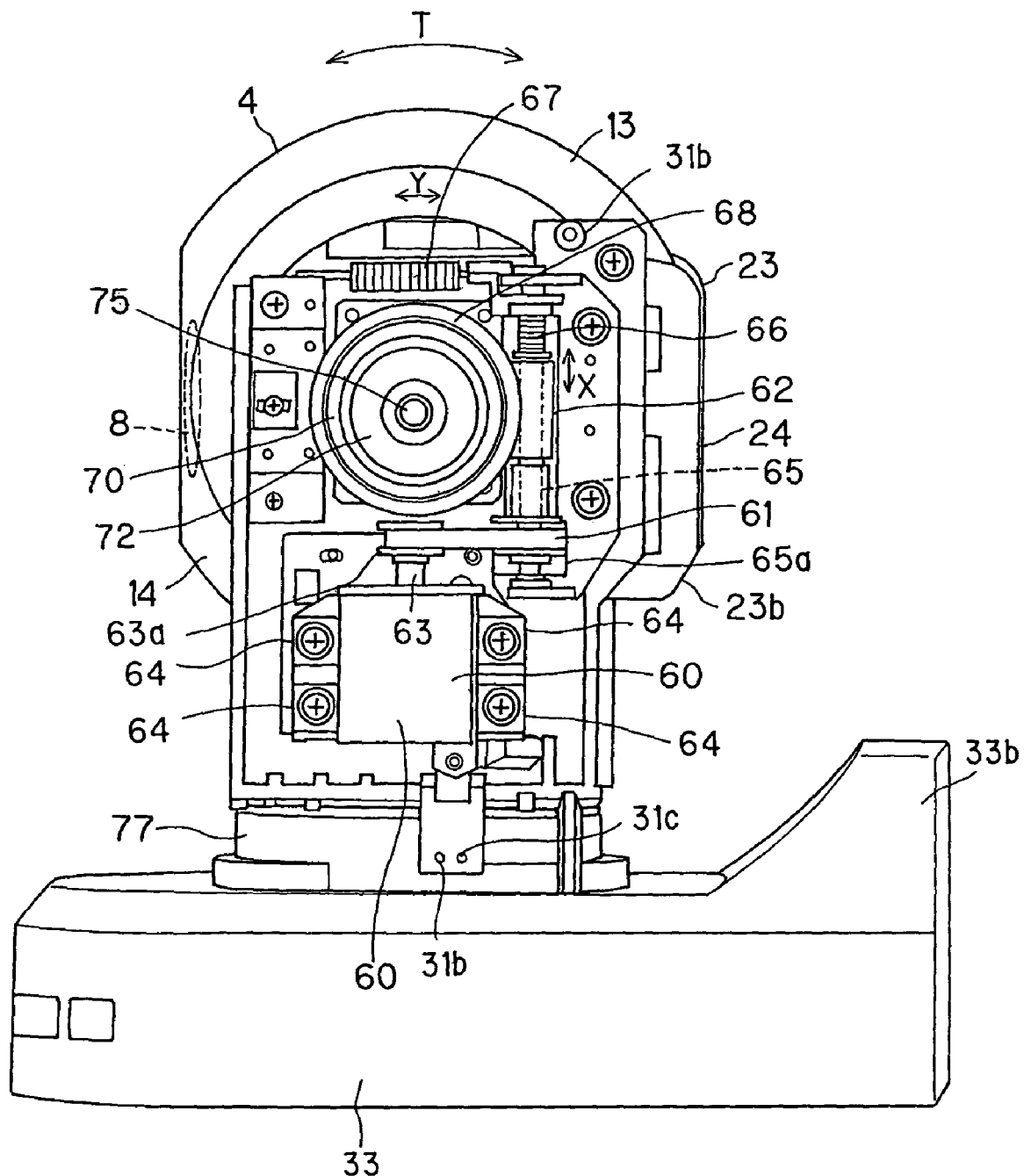
FIG. 12 is a side view of a tilt mechanism.
Figure 13:
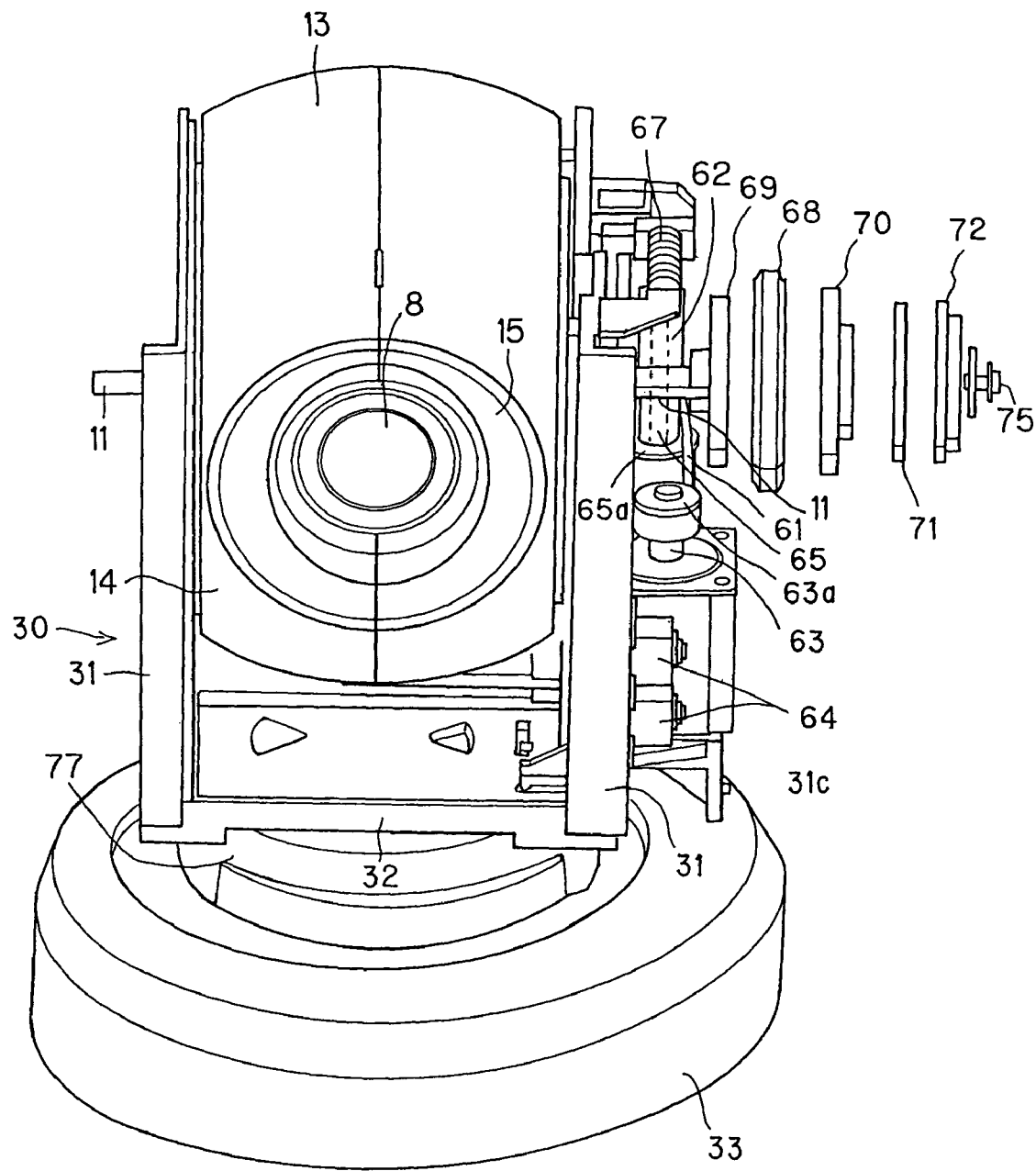
FIG. 13 is an exploded view of the tilt mechanism.

Referring to FIGS. 12 and 13, the tilt mechanism is provided on the outer lateral side of one of the rotation supports 31 of the support unit 30. The driving power is transmitted from a driving mechanism, provided to the rotation support 31, for driving the tilt mechanism. The driving mechanism is made up by a driving motor 60, an endless belt 61, connected to the driving motor 60, and a worm 62, connected to the endless belt 61, and configured for transmitting the driving power transmitted from the driving motor 60 through the endless belt 61 to a wheel 68 of the tilt mechanism.

The driving motor 60 is mounted to a lower part of the rotation support 31 and includes an output shaft 63 on its upper surface for developing the motive power. The output shaft 63 is provided with a pulley 63a for causing optimum rotation of the endless belt 61. The driving motor 60 is provided with a vibration absorber 64, formed of a material exhibiting resiliency, such as rubber, for absorbing the vibrations or sound in the course of driving.

The endless belt 61 is provided between the driving motor 60 and the worm 62 for transmitting the driving power from the driving motor 60 to the worm 62.

The worm 62 is secured to a worm shaft 65 and meshes with the wheel 68 of the tilt mechanism. A pulley 65a, connected to the endless belt 61, is mounted to one end of the worm shaft 65.

One end of a first elastic member 66 is connected to the end of the worm shaft 65 opposite to the end thereof provided with the pulley 64a. The other end of the first elastic member 66 is mounted to the rotation support 31. The worm shaft 65 is biased in a direction along the axis of the worm shaft 65, that is, in a direction of an arrow X in FIG. 12. The worm shaft 65 is biased in a direction substantially at right angles to the axial direction of the worm shaft 65, that is, in a direction towards a gear formed on the outer rim of the wheel 68, indicated by an arrow Y in FIG. 12, by a second elastic member having one end connected to the end of the worm shaft 65 connected to the first elastic member 66 and having the other end mounted to the rotation support 31. This prohibits the worm shaft 65 from wobbliing when the worm shaft is rotated under the driving force from the driving motor 60, so that the worm shaft may be reliably engaged with the gear formed on the outer rim of the wheel 68. The first elastic member 66 and the second elastic member 67 may, for example, each be a torsion coil spring.

With the above-described driving mechanism, the driving power from the driving motor is transmitted from the output shaft 63 to the endless belt 61, which is thereby rotated in a preset direction, with the worm shaft 65 rotating and with the worm 62 rotating as it meshes with the wheel 68. This causes rotation of the wheel 68 meshing with the worm 62 of the driving mechanism to transmit the driving power to the tilt mechanism to actuate the driving mechanism.

The tilt mechanism is made up by the wheel 68, receiving the driving power from the above-described driving mechanism, a first plate 69 and a second plate 70, holding the wheel 68 in-between, an elastic member 71 for pressuring the second plate onto the wheel 68, and a third plate 72 for holding the elastic member 71 in a state of being pressured against the second plate 70.

The wheel 68 is mounted on the tilt shaft 11 for meshing with the worm 62 and is formed on its rim with a gear part meshing with the worm 62. Since the wheel 68 is not secured to the tilt shaft 11, the wheel may be rotated when it is rotated in an adjacent position to the worm 62.

The first plate 69 is arranged closer to the imaging unit 4 than the wheel 68, and is passed through by the tilt shaft 11 at a mid part thereof so as to be secured by a set screw to the tilt shaft 11, as shown in FIG. 13. The second plate 70 is mounted to the tilt shaft 11 such as to hold the wheel 28 between it and the first plate 69. The second plate 70 includes a center pin hole 74, in which is inserted a pin 73 provided to the end of the tilt shaft 11, as shown in FIG. 14. The pin 73 is introduced into this pin hole 74 and mounted in this manner against rotation with respect to the tilt shaft 11.

The elastic member 67 is provided with a saucer spring, mounted on the opposite side to the wheel 68 of the second plate 70, for pressuring the second plate 70 against the wheel 68.

The third plate 66 is adjacent to the elastic member 67 and secured by a set screw 75 to the outermost part of the tilt shaft 11. The third plate 72 pressures the elastic member 67 onto the second plate 70.

Figure 15:
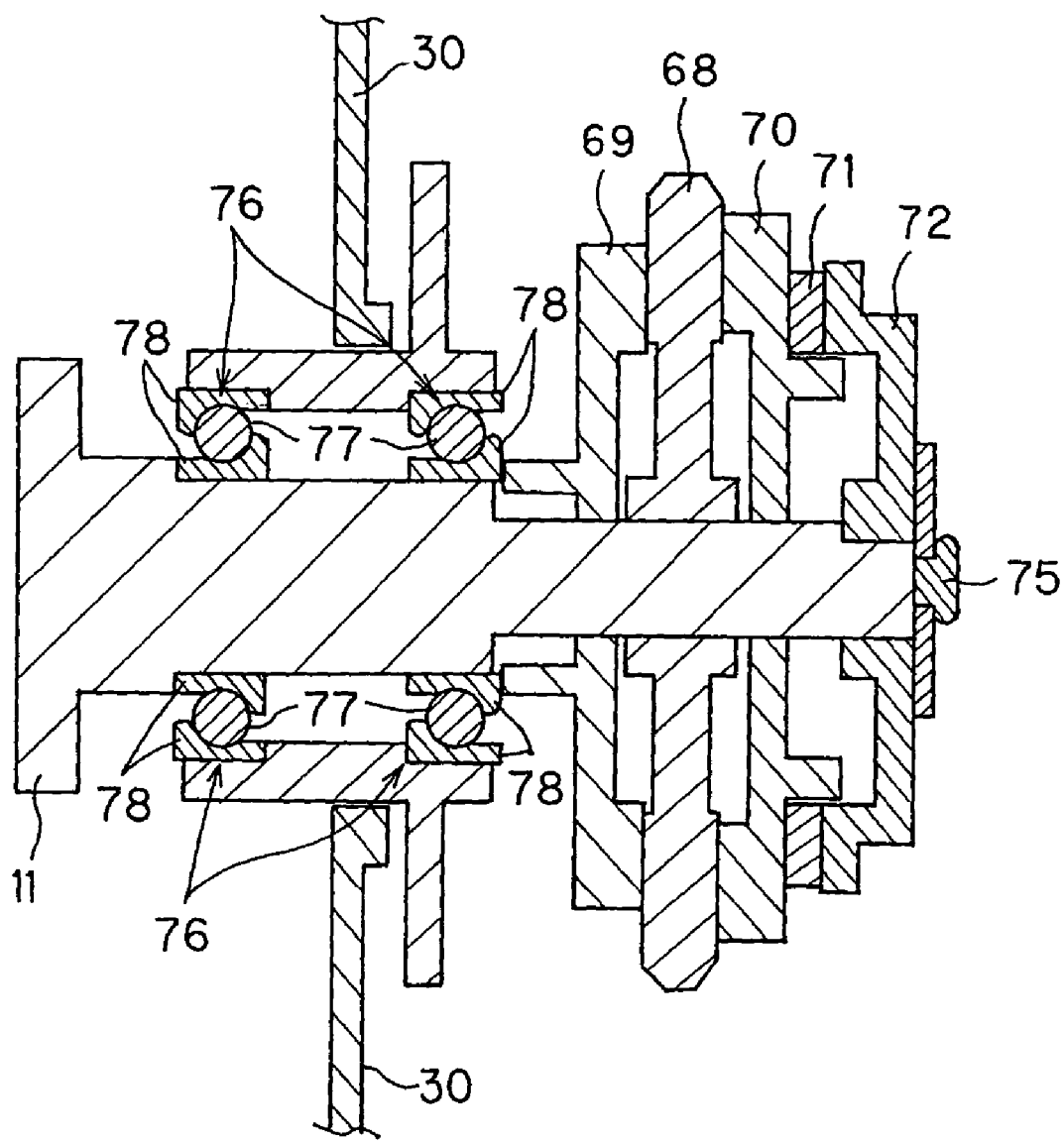
FIG. 15 is a cross-sectional view showing a ball bearing.

A ball bearing 76, for allowing stable rotation of the imaging unit 4, is provided between the first plate 69 and the imaging unit 4, as shown in FIG. 15. The ball bearing 76 includes a spherically-shaped roll 77 held by a pair of holding units 78. These holding units 78 of the ball bearing 76 are thrust against the roll 77 by the elastic member 67 to suppress wobbling between the roll 77 and the holding units 78.

Figure 16:
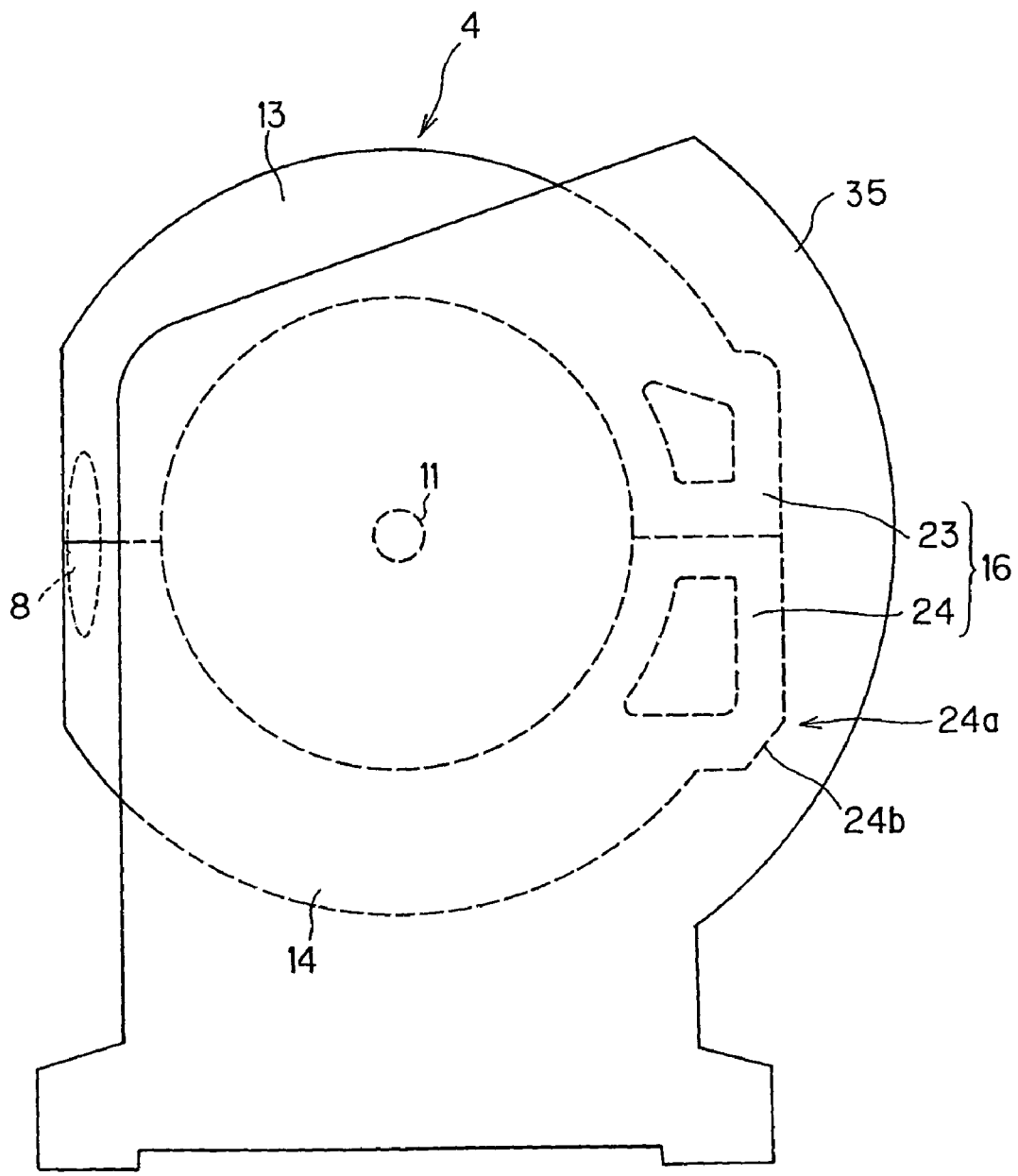
FIG. 16 is a side view of an imaging apparatus illustrating the state thereof where an imaging lens forms an angle of 0° with a tilt axis.
Figure 17:
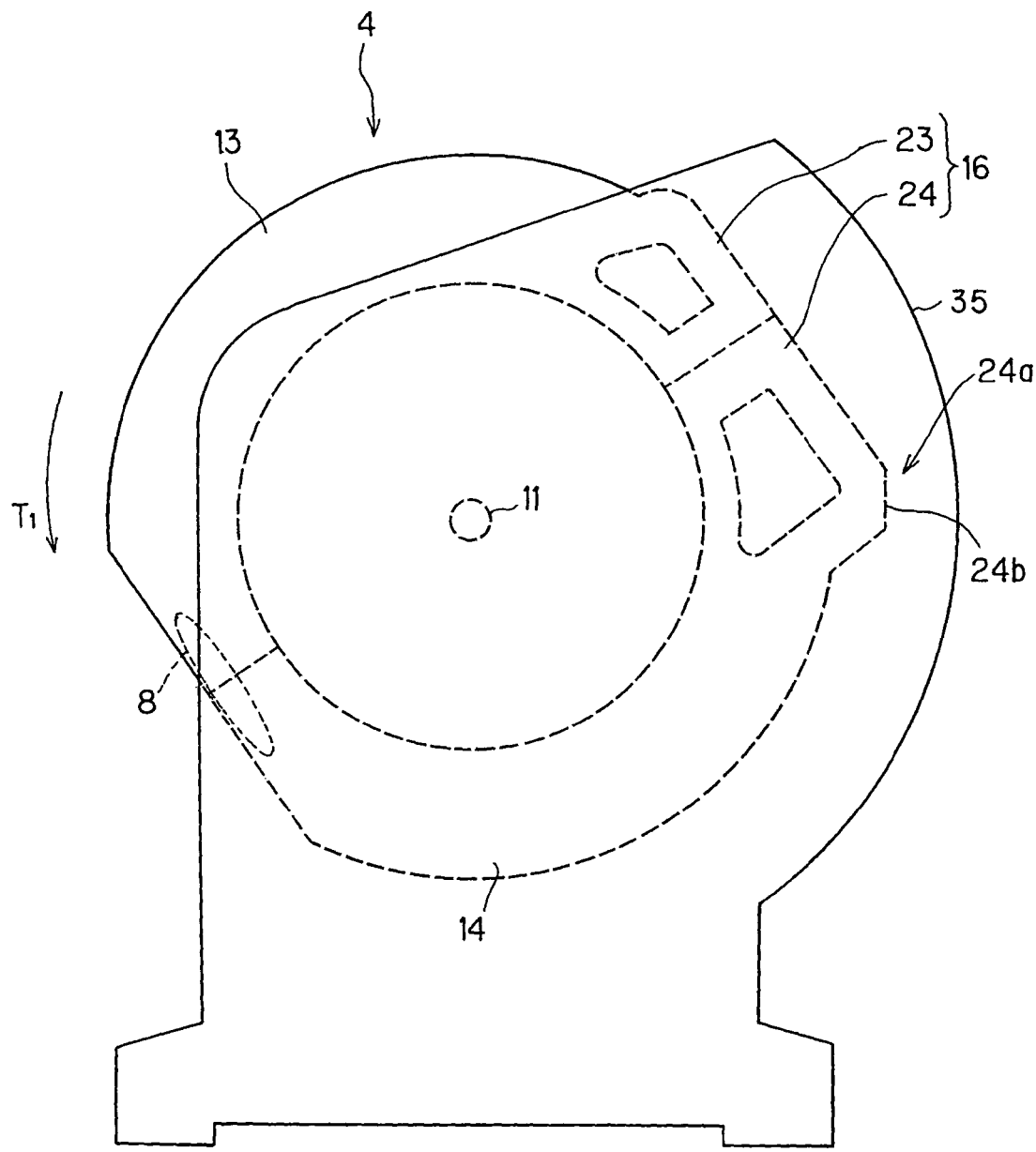
FIG. 17 is a side view of an imaging apparatus illustrating the state thereof where the imaging lens forms an angle of 30° with a tilt axis.

If, with the above-described tilt mechanism, the driving motor 60 is actuated, the wheel 68 is rotated, via endless belt 61 and worm 62, in a preset direction, from the state in which the imaging lens 8 is facing forwards, as shown in FIG. 16, for example, in a direction from the back surface towards the front surface of the imaging apparatus 1 (in a direction indicated by arrow T1), with the tilt shaft 11 as center, as shown in FIG. 17. By the rotation of the wheel 68, the first plate 69 and the second plate 70, pressured against the wheel 68, are rotated in the same direction, as one with the wheel 68, and hence the tilt shaft 11, to which are secured the first plate 69 and the second plate 70, is rotated. Thus, the imaging unit 4 is rotated so that the imaging lens 8 is directed downwards. When the imaging unit 4 is rotated in a direction of an arrow $T_1$ in the drawing, the imaging lug 16 of the imaging unit 4 is rotated substantially along the spherical shape of the back cover 35. However, since the back side of the back cover 35 is higher in height than the front side thereof, the imaging unit 4 may be rotated downwards, up to an imaging enabling sphere, without the imaging lug 16 abutting against the inner wall section of the back cover 35.

On the other hand, if the driving motor 60 has caused rotation of the worm shaft 65 in the opposite direction, the wheel 68 is rotated in a direction opposite to the direction of the arrow $T_1$ in the drawing, with the imaging unit 4 rotating upwards with the tilt shaft 11 as the center of rotation. Since the corner 24a of the imaging lug 24 of the imaging unit 4 is chamfered at 24b, the imaging unit 4 is rotated without the corner 24a of the imaging lug 24 contacting with the back cover 35. Hence, the tilt mechanism is able to cause rotation of the imaging unit 4, with respect to the support unit 30, within a range of the angle defined by the center of the tilt shaft 11 and the center of the imaging lens 8 of 30° in a downward direction and 90° in an upward direction.

Moreover, with the tilt mechanism, the user is able to cause rotation of the imaging unit 4 directly with his/her hand in the tilt direction. In this case, if, with the tilt mechanism, the user causes rotation of the imaging unit 4, the tilt shaft 11 is rotated in a direction in which the imaging unit 4 has been rotated, thereby causing rotation of the first and second plates 69, 70 secured to the tilt shaft 11. In the tilt mechanism, the first and second plates are rotated, however, the wheel 68, meshing with the worm 62 of the driving mechanism, not driven, is not rotated, thus producing the friction between the first plate 69 and the second plate 70. Hence, the imaging unit is rotated in the tilt direction against this force of friction. Moreover, at a start time point of the manual rotational operation in the tilt direction, the second plate 70 is connected to the tilt shaft 11 by the pin 73, so that it is possible to diminish the initial resistance encountered in manual rotation, based on the bumpy movement between the pin 73 and the pin opening 74 formed in the second plate 70.

The panning mechanism is provided on the first wiring board 37 of the component mounting unit 35 and is configured similarly to the above-described tilt mechanism, while being driven by a method similar to that for the above-described tilt mechanism. Consequently, the structure as well as the driving method for the panning mechanism is not explained specifically. The panning mechanism includes a driving motor 79 on a first wiring board 37, and also includes, in addition to the structure similar to the structure of the tilt mechanism, described above, a rotor 80 which is connected to a pan shaft, not shown, provided on the first wiring board 37, and which is provided at a mid part of the base unit 33, a frame 81 formed around the rotor 80, and a board housing section 82, formed between the rotor 80 and the frame 81, as shown in FIG. 18.

Figure 18:
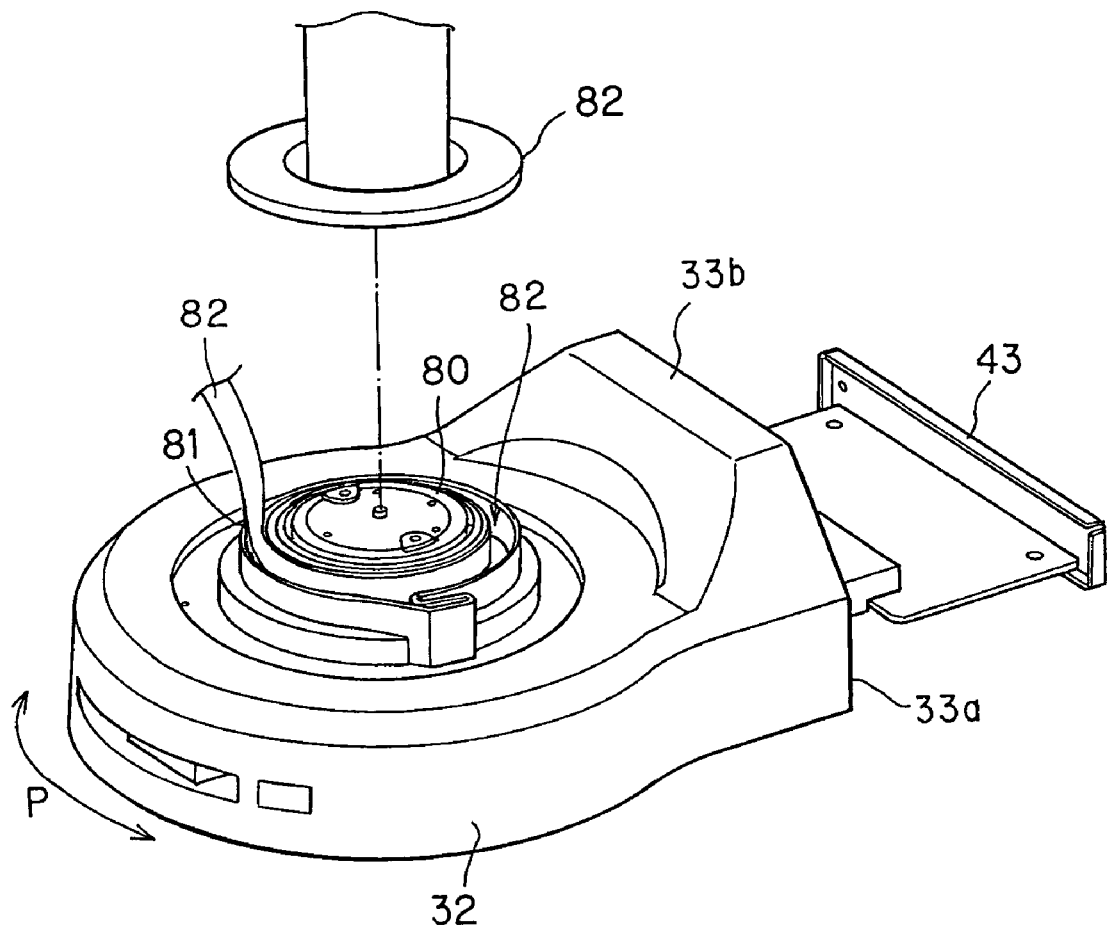
FIG. 18 is a perspective view showing a panning mechanism.

The rotor 80 is connected to the support unit 30 by screwing to the back side bottom surface of the support unit 30 for causing rotation of the support unit 30 in the panning direction, that is, in a direction indicated by arrow P in FIG. 18. With the panning mechanism, the panning shaft is rotated in the panning direction by a mechanism made up by a structure similar to that of the tilt mechanism, in such a manner that the rotor 80 connected to this panning shaft is rotated in the panning mechanism to cause rotation of the support unit 30 in the panning direction. Thus, the panning mechanism is able to cause rotation of the support unit 30 in a range of 170° towards left and 170° towards right, about the panning shaft as center.

The frame 81 is formed on the same surface as that of the base unit 33 on which the rotor 80 is formed, for encircling the rotor 80 with a preset gap from the rotor 80. The frame 81 forms a board housing section 82, as a preset gap provided between the frame 81 and the rotor (rotor plate) 80, for housing a wiring board for electrically interconnecting the imaging unit 4 and the component mounting unit 35.

Within the board housing section 82, an elongated flexible substrate 83 for electrically interconnecting the imaging unit 4 and the component mounting unit 35 is housed in a coiled shape about the rotor 80 as center. When the support unit 30 is rotated in the panning direction, the flexible substrate 83, housed in the housing section as a coil about the rotor 80, is pulled out in keeping with the rotation. Within the board housing section 82, a closure member 84 for closing the side of the support unit 30 is provided between the board housing section 82 and the support unit 30. The closure member 84 is formed as a ring of the approximately same width as the board housing section 82. The outer peripheral surface of the rotor 80, and the closure member 84, forming the board housing section 82, are formed of a resin material exhibiting low friction, such as polyacetal, for lowering the friction between the support unit 30 and the flexible substrate 83, housed in the board housing section 82, when the support unit 30 is rotated in the panning direction.

Thus, with the above-described tilt and panning mechanisms, the imaging unit 4 may be rotated in the tilt direction relative to the support unit 30, while the support unit 30 may be rotated in the panning direction relative to the support unit 30, whereby the image unit 5 may be rotated, along with the front cover 34 and the back cover 35, mounted on the support unit 30, in the panning direction relative to the base unit 33. Thus, with the tilt mechanism and the panning mechanism, the imaging apparatus 1 is able to capture a wide range image.

With the above-described imaging apparatus 1, in which the wiring board, carrying a power supply circuit and a signal processing circuit, is split into two boards, namely the first wiring board 37, carrying the power supply circuit, and the second wiring board 38, carrying the signal processing circuit, and in which the first wiring board 37 and the second wiring board 38 are arranged side by side substantially parallel to each other along the bottom surface of the base unit 33, the mounting area of the wiring board may be reduced. Thus, with the imaging apparatus 1, the base unit 33, housing the wiring board, may be reduced in size, with the consequence that the apparatus in its entirety may be reduced in size and hence in weight. Moreover, with the imaging apparatus 1, provided with the panning mechanism and with the tilt mechanism, the imaging unit 4 may be rotated freely in the up-and-down direction and in the left-and-right direction, thus assuring wide-range image pickup operations. In addition, an object in its entirety may be imaged in a wide room or outdoors. Furthermore, with the use of a 3CCD, described above, an object may be imaged to a desired imaging size and to a high image quality.

With the imaging apparatus 1, in which the upper and lower parts of the cover for the imaging device 7, housing the imaging unit 4, are substantially spherically-shaped and the portion of the imaging device 6 protruded from the spherical shape is covered up by a substantially parallelepipedically-shaped imaging lug 16, the imaging cover may be of the smallest size possible relative to the imaging device 6. Thus, with the imaging apparatus 1, in which the upper and lower parts of the imaging cover are substantially spherically-shaped, the imaging unit 4 may be rotated smoothly when the imaging unit 4 is rotated in the tilt direction, thus reducing the overall size of the apparatus.

What is claimed is:

1. An imaging apparatus, comprising:
   an imaging unit which images an object;
   a casing carrying said imaging unit and provided on a bottom part thereof with a component mounting unit for mounting components thereon;
   a first wiring board arranged on said component mounting unit extending along a bottom plate of said bottom part;
   a second wiring board arranged non-movably above and substantially parallel to said first wiring board towards said imaging unit in a spaced apart relation with respect to said first wiring board;
   a power supply circuit formed directly on said first wiring board;
   a signal processing circuit formed on said second wiring board and which transforms an optical image from an imaging lens into electrical signals and to output the electrical signals to an output terminal;
   a panning mechanism which rotates said imaging unit in a panning direction is mounted on said first wiring board, said first wiring board being connected to said component mounting unit to secure a position of said first wiring board when said panning mechanism rotates said imaging unit;
   a rotor to rotate said imaging unit in a panning direction;
   a frame mounted to said bottom part for encircling said rotor;
   an elongated flexible board electrically interconnecting said imaging unit and said first wiring board and/or said second wiring board, the elongated flexible board being housed in a coiled shape between said rotor and said frame.

2. The imaging apparatus according to claim 1, wherein
   said component mounting unit includes a protrusion towards a back surface side extending in a direction substantially at right angles to the bottom plate of said bottom part, and a third wiring board having one or a plurality of connectors is provided for extending substantially at right angles to the bottom plate of said bottom part.

3. The imaging apparatus according to claim 1, wherein said first wiring board is provided on the front surface side of said casing, said second wiring board being mounted on a back surface side of said casing, and an extension unit mounting section which accepts an insertion of an extension unit from an insertion/ejection opening provided in a back surface of said bottom part is mounted between a bottom plate of said bottom part and said second wiring board.

4. The imaging apparatus according to claim 1, wherein said panning mechanism includes a panning driving mechanism as a driving source of said panning mechanism.

5. The imaging apparatus according to claim 4, further comprising:

a tilt mechanism which rotates said imaging unit in a tilt direction; and a tilt driving mechanism, as a driving source of said tilt mechanism, provided on said casing.

6. The imaging apparatus according to claim 5 wherein, in said panning mechanism and/or the tilt mechanism, a first plate and a second plate, secured to a shaft part connected to said imaging unit, are pressured against a wheel to which is transmitted the driving force from said panning driving mechanism and/or said tilt driving mechanism.

7. An imaging apparatus, comprising:

an imaging unit which images an object;

a casing carrying said imaging unit and provided on a bottom part thereof with a component mounting unit for mounting components thereon;

a first wiring board arranged on said component mounting unit extending along a bottom plate of said bottom part;

a second wiring board arranged above and substantially parallel to said first wiring board towards said imaging unit in a spaced apart relation with respect to said first wiring board;

a panning mechanism which rotates said imaging unit in a panning direction, the panning mechanism including a panning driving mechanism as a driving source of said panning mechanism, directly mounted on said first wiring board;

a tilt mechanism which rotates said imaging unit in a tilt direction;

a tilt driving mechanism, as a driving source of said tilt mechanism, provided on said casing, wherein in said panning mechanism and/or the tilt mechanism, a first plate and a second plate, secured to a shaft part connected to said imaging unit, are pressured against a wheel to which is transmitted the driving force from said panning driving mechanism and/or said tilt driving mechanism, said panning driving mechanism and/or said tilt driving mechanism, generating the driving force for said panning mechanism and/or said tilt mechanism, include a worm meshing with said wheel; and a rotational shaft, carrying said worm, is biased by a first elastic member in one or the other axial direction of said rotational shaft, and also is biased by a second elastic member in a direction substantially perpendicular to said axial direction.

8. An imaging apparatus, comprising:

an imaging unit which images an object;

a casing carrying said imaging unit and provided on a bottom part thereof with a component mounting unit for mounting components thereon;

a first wiring board arranged on said component mounting unit extending along a bottom plate of said bottom part;

a second wiring board arranged above and substantially parallel to said first wiring board towards said imaging unit in a spaced apart relation with respect to said first wiring board;

a panning mechanism which rotates said imaging unit in a panning direction;

a tilt mechanism which rotates said imaging unit in a tilt direction; and a tilt driving mechanism, as a driving source of said tilt mechanism, provided on said casing, wherein said panning mechanism includes a panning driving mechanism as a driving source of said panning mechanism, directly mounted on said first wiring board, a rotor mounted to a shaft part and which rotates said imaging unit in a panning direction, a frame mounted to said bottom part for encircling said rotor, and an elongated flexible board electrically interconnecting said imaging unit and said first wiring board and/or said second wiring board, the elongated flexible board being housed coiled between said rotor and said frame.

9. The imaging apparatus according to claim 8 wherein said board housing section is formed of a low friction material.

10. The imaging apparatus according to claim 8 wherein said casing includes a front cover and a back cover; and wherein a connecting portion between said front cover and the back cover is provided on a back surface side of said imaging unit.

11. The imaging apparatus according to claim 10, wherein said front cover has an upper back surface side part higher in level than an upper front surface side part.

12. The imaging apparatus according to claim 8 wherein said imaging unit includes a lens part on a front side and an imaging lug substantially protruding on a back surface opposite to said lens part; and wherein said imaging lug is chamfered at a corner along the tilt direction of said imaging unit.

* * * * *